(12) United States Patent
Stacey et al.

(10) Patent No.: US 12,266,581 B2
(45) Date of Patent: Apr. 1, 2025

(54) ELECTRONIC SUBSTRATES HAVING HETEROGENEOUS DIELECTRIC LAYERS

(71) Applicant: Intel Corporation, Santa Clara, CA (US)

(72) Inventors: Joshua Stacey, Chandler, AZ (US); Whitney Bryks, Tempe, AZ (US); Sarah Blythe, Chandler, AZ (US); Peumie Abeyratne Kuragama, Chandler, AZ (US); Junxin Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1004 days.

(21) Appl. No.: 17/085,177

(22) Filed: Oct. 30, 2020

(65) Prior Publication Data
US 2022/0139792 A1    May 5, 2022

(51) Int. Cl.
*H01L 23/18*    (2006.01)
*H01L 23/29*    (2006.01)
*H01L 23/31*    (2006.01)
*H01L 23/522*    (2006.01)

(52) U.S. Cl.
CPC .......... *H01L 23/295* (2013.01); *H01L 23/18* (2013.01); *H01L 23/31* (2013.01); *H01L 23/5226* (2013.01)

(58) Field of Classification Search
None
See application file for complete search history.

(56) References Cited

U.S. PATENT DOCUMENTS

| | | | |
|---|---|---|---|
| 10,515,829 B2* | 12/2019 | Wu | H01L 21/565 |
| 10,553,456 B2* | 2/2020 | Takehara | H01L 21/561 |
| 2021/0035896 A1* | 2/2021 | Huang | H01L 23/49833 |

FOREIGN PATENT DOCUMENTS

| | | | |
|---|---|---|---|
| KR | 20190009259 A | * | 7/2023 |
| WO | WO-2021075207 A1 | * | 4/2021 |

OTHER PUBLICATIONS

Machine translation of WO-2021075207-A1 (Year: 2021).*
Machine translation of KR-20190009259-A (Year: 2023).*

* cited by examiner

*Primary Examiner* — Yara B Green
*Assistant Examiner* — Tessa Elizabeth Mcnamee
(74) *Attorney, Agent, or Firm* — Essential Patents Group, LLP

(57) ABSTRACT

An electronic substrate may be formed having at least one dielectric layer that is heterogeneous. The heterogeneous dielectric layer may comprise three separately formed materials that decouple the critical regions within a dielectric layer and allow for the optimization of desired interfacial properties, while minimizing the impact to the bulk requirements of the electronic substrate.

20 Claims, 8 Drawing Sheets

ELECTRONIC SUBSTRATES HAVING HETEROGENEOUS DIELECTRIC LAYERS

TECHNICAL FIELD

Embodiments of the present description generally relate to the field of integrated circuit package or assembly fabrication, and, more specifically, to the fabrication of dielectric layers in electronic substrates used to route electrical signals for integrated circuit packages or assemblies.

BACKGROUND

Electronic substrates, used in the fabrication of integrated circuit devices, are generally composed of alternating layers of dielectric material (such as organic materials) and metal (such as copper) which is patterned to form conductive routes. At least one integrated circuit device, such as a silicon die having integrated circuitry formed therein, may be physically and electrically attached to the electronic substrate, such that the conductive routes in the electronic substrate appropriately routes electrical signals to and from the integrated circuitry of the integrated circuit device(s).

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like.

As these goals are achieved, the integrated circuit devices become smaller. Accordingly, the electronic substrates, to which the integrated circuit devices are electrically attached, must also because smaller, which places demands on the performance and reliability thereof. As previously discussed, electronic substrates are generally composed of alternating layers of dielectric material and metal which is patterned to form conductive routes. Each of dielectric material layers are homogeneous (single material layer), which may not be ideal for optimal substrate performance due to known trade-offs when tuning the desired bulk properties and the upper and lower interfacial properties of the dielectric material (e.g. coefficient of thermal expansion, dielectric-to-metal adhesion, tangent loss-to-dielectric constant ratio ($D_f/D_k$)), mechanical reliability, and the like), as will be understood to those skilled in the art.

With regard to improving dielectric-to-metal adhesion, the current strategy relies upon roughening of the metal pattern to generate mechanical anchor points for the dielectric material and/or the use of a spray-deposited organic adhesion promotor (OAP) to generate a chemical bond at the metal/dielectric interface. However, the metal roughening process presents additional limitations in the form of decreased electrical performance of the conductive routes with increasing metal roughness. This decreased electrical performance results from the skin-effect, as will be understood to those skilled in the art. Furthermore, although the use of an organic adhesion promotor was intended to improve dielectric-to-metal adhesion with lower roughness, there are known process challenges with regard to voiding, thickness control, and performance degradation due to moisture absorption and oxidation, as will be understood to those skilled in the art. Additionally, when a seed layer is electrolessly deposited for the formation of the conductive routes, the organic adhesion promotor will not affect the seed layer-to-metal interface. This may be an issue since such seed layers have known adhesion limitations with low loss dielectric materials that may result in missing portions of the seed layer and/or metal flaking defects.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
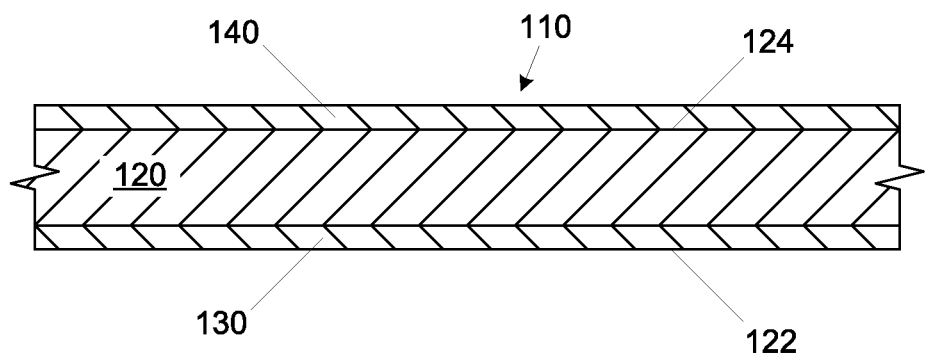
FIG. 1 is a side cross-sectional view of a heterogeneous dielectric layer, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad.

The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

For the purposes of the present disclosure, the term "high aspect ratio" means a structure has a height (z-direction) to width (x-direction) ratio of greater than about 2.

Embodiments of the present description relate to processes and structures resulting therefrom comprising heterogeneous or multilayered dielectric layers in the fabrication of electronic substrates for integrated circuit packages. In one embodiment, the heterogeneous dielectric layer comprises three separately formed materials that decouple the critical regions within a dielectric layer and allow for the optimization of desired interfacial properties, while minimizing the impact to the bulk requirements of the electronic substrate.

FIG. 1 illustrated an embodiment of the present description, wherein a heterogeneous dielectric material layer 110 comprises a bulk dielectric layer 120 having a first surface 122 and an opposing second surface 124, an encapsulation layer 130 on the first surface 122 of the bulk dielectric layer 120, and a primer layer 140 on the second surface 124 of the bulk dielectric layer 124. One potential advantage of the heterogeneous dielectric layer 110 may be that the different material layers can be tuned to achieve appropriate metal-to-dielectric adhesion which will eliminate the occurrence of delamination without compromising the mechanical integrity of the heterogeneous dielectric layer 110, as will be discussed.

Figure 2:
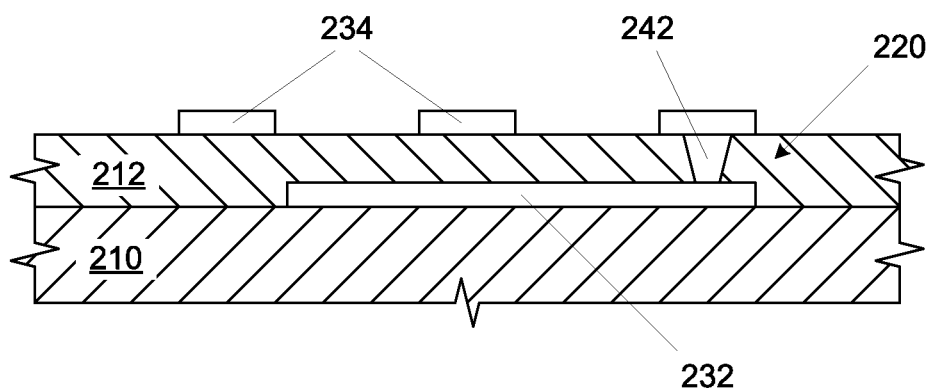
FIGS. 2-9 are side cross-sectional views of a process for the fabrication of an electronic substrate, according to an embodiment of the present description.

FIGS. 2-9 illustrate a process for fabricating an electronic substrate 200 for an integrated circuit assembly, according to an embodiment of the present description. As shown in FIG. 2, a dielectric material layer 212 may be formed on a substrate 210. The substrate 210 may be any appropriate structure, such as a dielectric material or a substrate core, as will be understood to those skilled in the art. The dielectric material layer 212 may comprise one or more dielectric material layers, which may be composed of an appropriate dielectric material, including, but not limited to, bismaleimide triazine resin, fire retardant grade 4 material, polyimide material, silica filled epoxy material, glass reinforced epoxy material, low temperature co-fired ceramic materials, and the like, as well as low-k and ultra low-k dielectrics (dielectric constants less than about 3.6), including, but not limited to, carbon doped dielectrics, fluorine doped dielectrics, porous dielectrics, organic polymeric dielectrics, fluoropolymers, and the like.

Conductive routes 220 or "metallization" may be formed on and extending through the dielectric layer 212. These conductive routes 220 may be a combination of conductive traces (shown as a first conductive trace 232 on the substrate 210 and second conductive traces 234 on the dielectric layer 212) and at least one conductive vias 242 extending through the dielectric material layer 212. The structure and fabrication of conductive traces and conductive vias are well known in the art and are not shown or described for purposes of clarity and conciseness. The conductive routes 220 may be made of any appropriate conductive material, including but not limited to, metals, such as copper, silver, nickel, gold, and aluminum, alloys thereof, and the like. In one specific embodiment of the present description, the conductive routes 220 may be copper.

Figure 3:
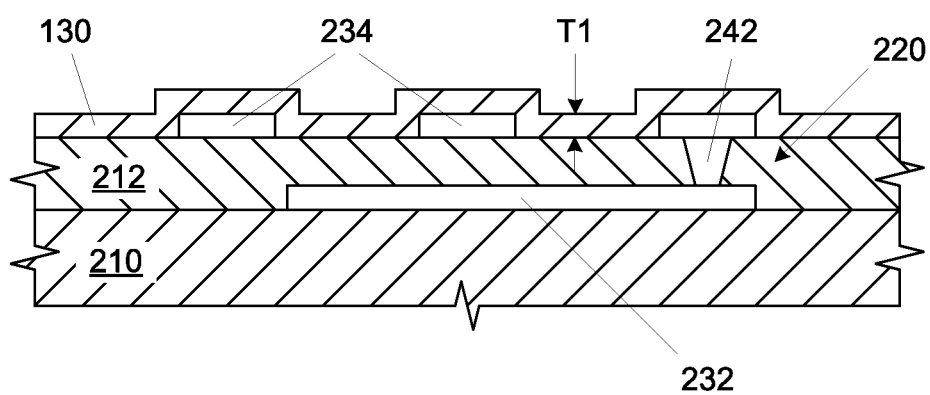

As shown in FIG. 3, the encapsulation layer 130 may be formed on the dielectric layer 212 and the conductive traces 234. The encapsulation layer 130 encapsulates the conductive traces 234 and may be selected or tuned to adhere to the conductive traces 234 and the dielectric layer 212. In one embodiment of the present description, the encapsulation layer 130 may be selected or tuned for preferred electrical properties while maintaining strong adhesion to the conductive traces even when the conductive traces 234 have a relatively "low roughness". In one embodiment, the encapsulation layer 130 may comprise, but is not limited to, epoxy resin, perfluorocyclobutane resin, perfluorinated alkyl resin, and the like, having a filler material, including, but not limited to, silica and the like, dispersed therein. In another embodiment of the present descriptive, the encapsulation layer 130 may be functionalized with an aromatic amine. In still another embodiment of the present description, the encapsulation layer 130 may have a thickness T1 of less than about 5 microns. In a further embodiment of the present description, the encapsulation layer 130 may be a conformal layer. In specific embodiment, the encapsulation layer 130 may have less than or equal to about 50% by volume of filler material with a remainder being a carrier material. In a further specific embodiment, the filler material of the encapsulation layer 130 may have average diameter on the nanometer level.

Figure 4:
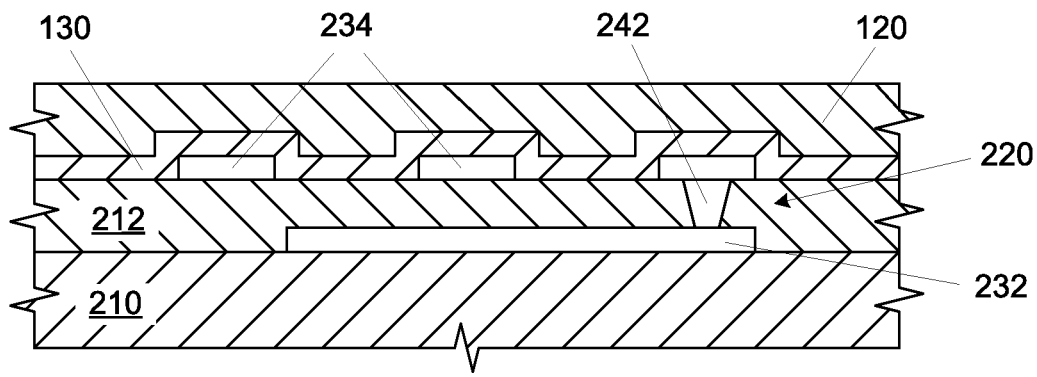

As shown in FIG. 4, the bulk dielectric layer 120 may be formed on the encapsulation layer 130. The bulk dielectric layer 120 may be selected or tuned to provide the majority of electrical isolation for the heterogeneous dielectric material layer 110 and may be targeted for optimal physical properties to achieve high mechanical reliability. In one embodiment, the bulk dielectric material 110 may comprise a carrier material, including, but not limited to, epoxy resin, benzocyclobutene resin, polyolefin, polyimide, and the like, having a filler material, including, but not limited to, silica and the like, dispersed therein. In an embodiment, the bulk dielectric layer 120 may be a high filler-content material layer. In specific embodiment, the bulk dielectric layer 120 may have less than about 80% by volume of filler material with a remainder being a carrier material. In a further specific embodiment, the filler material of the bulk dielectric layer 120 may have average diameter on the micrometer level.

Figure 5:
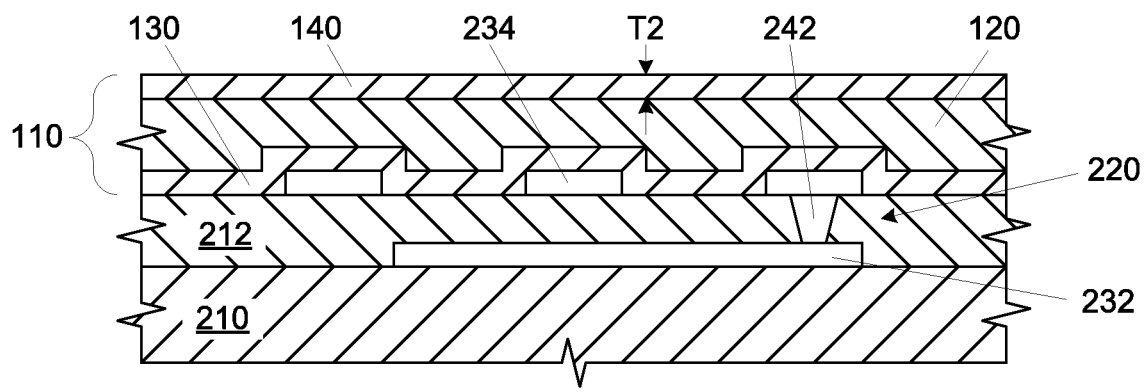

As shown in FIG. 5, the primer layer 140 may be formed on the bulk dielectric layer 120 to form the heterogeneous dielectric material layer 110. The primer layer 140 may be selected or tuned to provide adhesion to the bulk dielectric layer 120 and subsequently deposited metal layers, such as an electrolessly deposited seed layer and may be optimized for good desmearability, as will be understood to those skilled in the art. In one embodiment, the primer layer 140 may comprise a carrier material, including, but not limited to, epoxy resin, polyimide, and the like, having a filler material, including, but not limited to, silica and the like, dispersed therein. In an embodiment, the primer layer 140 may be a carrier-rich material layer. In another embodiment of the present descriptive, the primer layer 140 may be functionalized with an carbodiimide. In specific embodiment, the primer layer 140 may have less than about 50% by volume of filler material with a remainder being a carrier material. In still another embodiment of the present description, the primer layer 140 may have a thickness T2 of less than or equal to about 5 microns.

In one embodiment of the present description, the bulk dielectric layer 120, the encapsulation layer 130, and the primer layer 140 may be selected such that the bulk dielectric layer 120 may have slight miscibility with the encapsulation layer 130 and may have slight miscibility with the primer layer 140. The slight miscibility may allow for a small degree of intermixing that will prevent delamination between the bulk dielectric layer 120 and the encapsulation layer 130 and between the bulk dielectric layer 120 and the primer layer 140 after cure, as will be understood to those skilled in the art. Furthermore, this intermixing may generate a first transition layer (not shown) between the bulk dielectric layer 120 and the encapsulation layer 130 and a second transition layer (not shown) between the bulk dielectric layer 120 and the primer layer 140.

Figure 6:
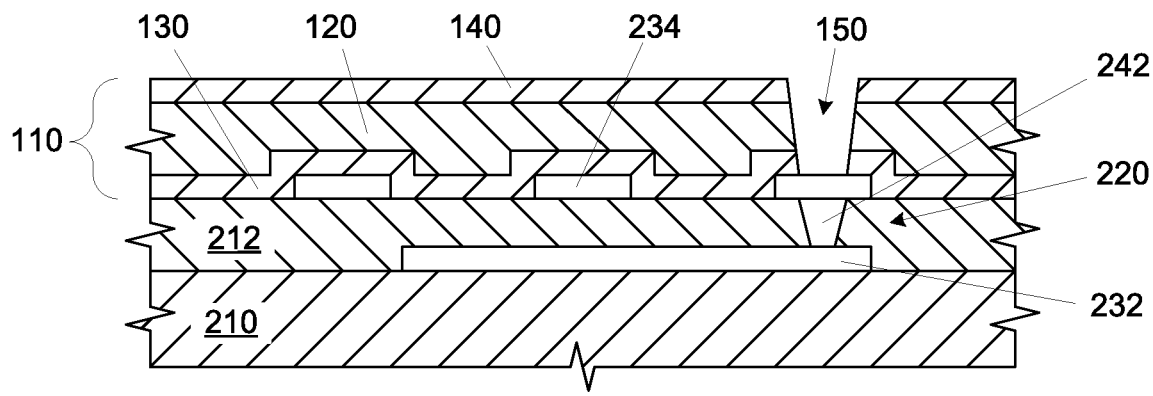
Figure 7:
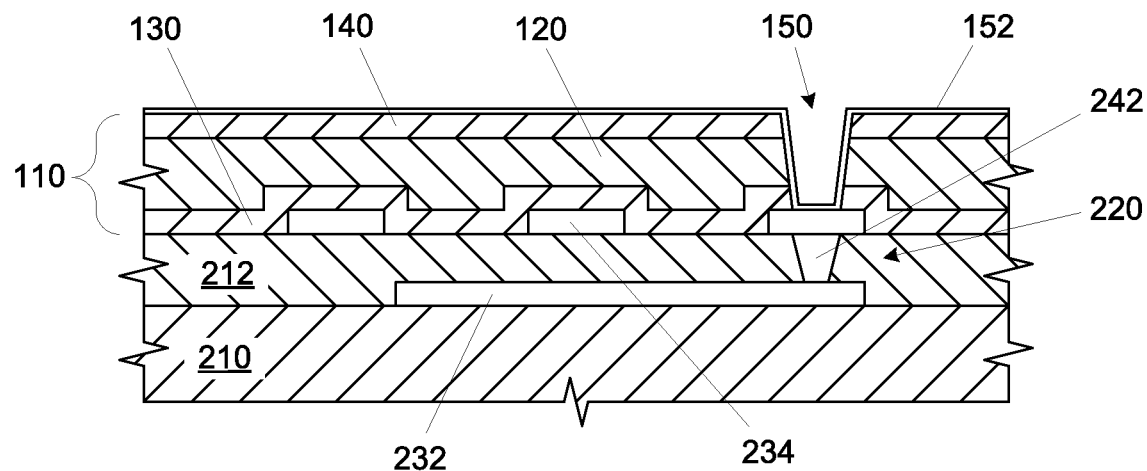
Figure 8:
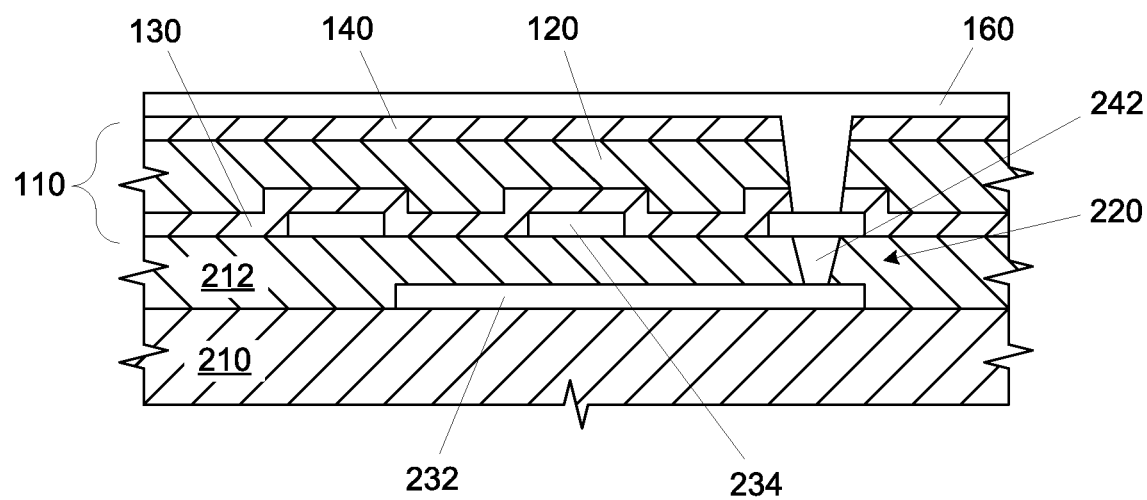
Figure 9:
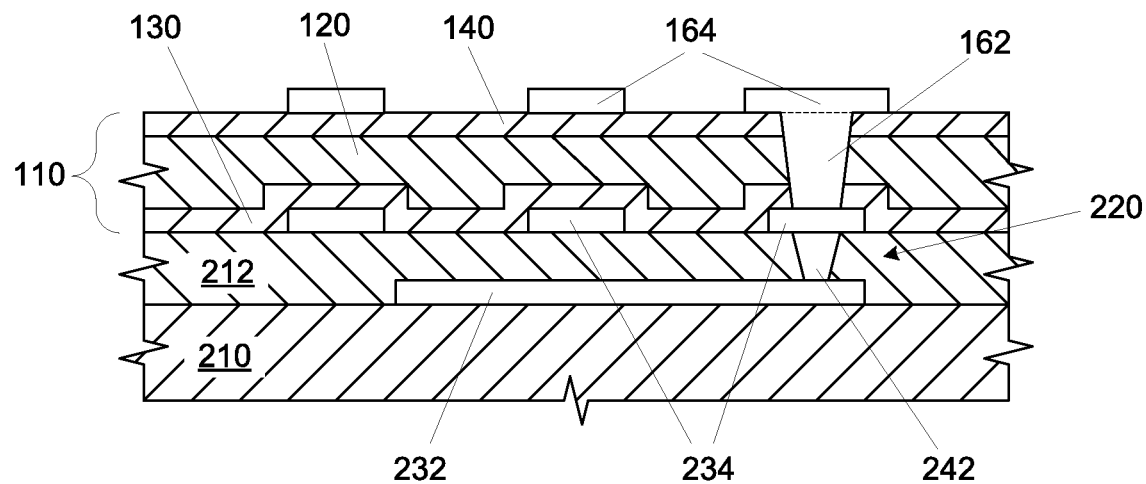

As shown in FIG. 6, an opening 150 may be formed through the primer layer 140, the bulk dielectric layer 120, and the encapsulation layer 130. The opening 150 may be formed by any technique known in the art, including, but not limited to, laser drilling, ion ablation, and lithography. As shown in FIG. 7, a seed layer 152 may be deposited, such as by electroless plating, over the primer layer 140 and into the opening 150. As shown in FIG. 8, a conductive material layer 160 may be formed on the seed layer 152 (see FIG. 6), such as by plating, wherein the seed layer 152 (see FIG. 6) subsumed into the conductive material layer 160. In one embodiment of the present description, the conductive material layer 160 may be any appropriate conductive material, including, but not limited to, metals, such as copper, silver, nickel, gold, and aluminum, alloys thereof, and the like. In one specific embodiment of the present description, the conductive material layer 160 may be copper. As shown in FIG. 9, the conductive material layer 160 may be patterned, such as lithography, to formed conductive vias 162 and conductive traces 164. It is understood that the processes illustrated in FIGS. 2-9 may be repeated to form any number of desired heterogeneous dielectric material layers 110 and associated metallization.

Figure 10:
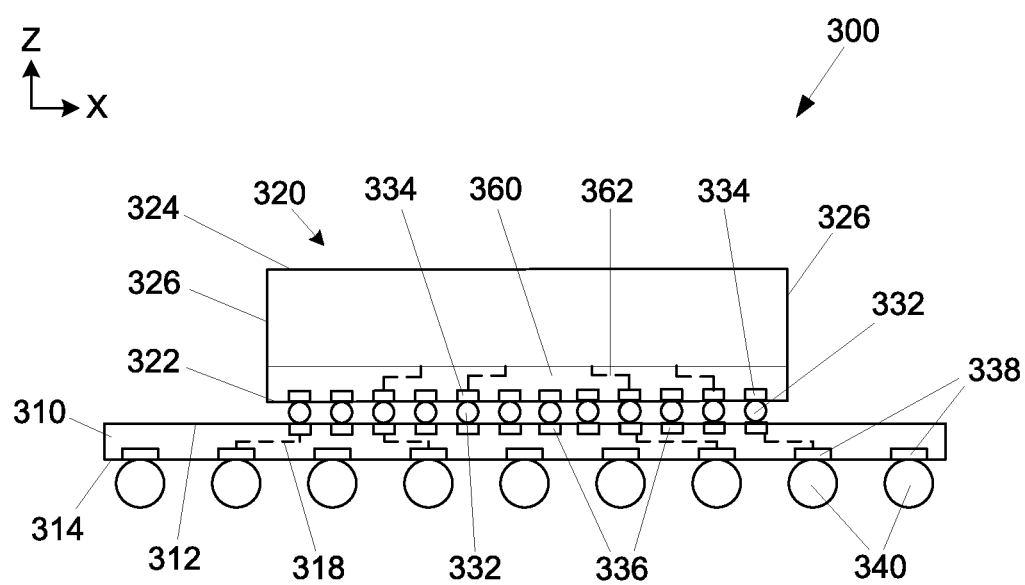
FIG. 10 is a side cross-sectional views of an integrated circuit package having an electronic substrate that contains at least one heterogeneous dielectric layer, according to an embodiment of the present description.

FIG. 10 illustrates an integrated circuit assembly 300 having at least one integrated circuit device 320 electrically attached to an electronic substrate 310 in a configuration generally known as a flip-chip or controlled collapse chip connection ("C4") configuration, according to an embodiment of the present description.

The electronic substrate 310 may be any appropriate structure, including, but not limited to, an interposer. The electronic substrate 310 may have a first surface 312 and an opposing second surface 314. The electronic substrate 310 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. At least one dielectric material layer of the plurality of dielectric material layer (not specifically shown, may include at least one heterogeneous dielectric material layer 110 of the present description, as discussed with regard to FIGS. 1-9.

The electronic substrate 310 may further include conductive routes 318 or "metallization" (shown in dashed lines) extending through the electronic substrate 310. As will be understood to those skilled in the art, the conductive routes 318 may be a combination of conductive traces (not shown) and conductive vias (not shown) extending through the plurality of dielectric material layers (not shown).

Figure 11:
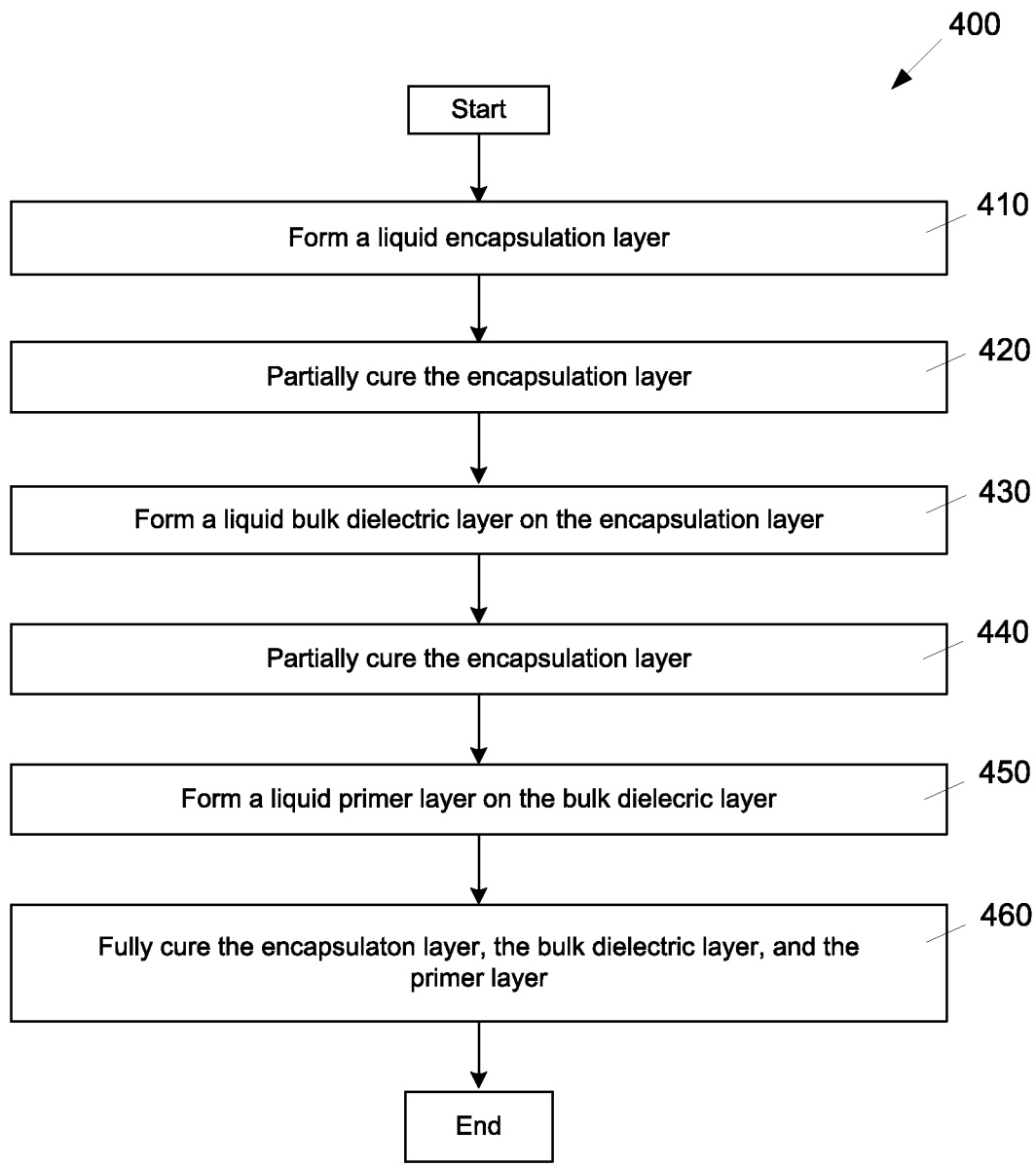
FIG. 11 is a flow chart of a process of fabricating a heterogeneous dielectric layer for an electronic substrate, according to an embodiment of the present description.

The integrated circuit device 320 may be any appropriate device, including, but not limited to, a microprocessor, a chipset, a graphics device, a wireless device, a memory device, an application specific integrated circuit, a transceiver device, an input/output device, combinations thereof, stacks thereof, or the like. As shown in FIG. 11, the integrated circuit device 320 may have a first surface 322, an opposing second surface 324, and at least one side 326 extending between the first surface 322 and the second surface 324. The integrated circuit device 320 may be a monolithic silicon die or plurality of molded composited dice.

The integrated circuit device 320 may include an interconnection layer 360 at the first surface 312 thereof. The interconnection layer 360 may comprise a plurality of dielectric material layers (not shown) conductive routes 362 or "metallization" (shown in dashed lines) extending through the interconnection layer 360. As will be understood to those skilled in the art, the conductive routes 362 may be a combination of conductive traces (not shown) and conductive vias (not shown) extending through the plurality of dielectric material layers (not shown).

In an embodiment of the present description, the first integrated circuit device 320 may be electrically attached to the electronic substrate 310 with a plurality of device-to-substrate interconnects 332. In one embodiment of the present description, the device-to-substrate interconnects 332 may extend between bond pads 336 on the first surface 312 of the electronic substrate 310 and bond pads 334 on the first surface 322 of the integrated circuit device 320. The device-to-substrate interconnects 332 may be any appropriate electrically conductive material or structure, including, but not limited to, solder balls, metal bumps or pillars, metal filled epoxies, or a combination thereof. In one embodiment, the device-to-substrate interconnects 332 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 332 may be copper bumps or pillars. In a further embodiment, the device-to-substrate interconnects 332 may be metal bumps or pillars coated with a solder material.

The bond pads 334 may be in electrical contact with the conductive routes 362, which may, in turn, be in electrical communication with integrated circuitry (not shown) within the integrated circuit device 320. The bond pads 336 on the first surface 312 of the electronic substrate 310 may be in electrical contact with the conductive routes 318. The conductive routes 318 may extend through the electronic substrate 310 and be connected to bond pads 338 on the second surface 314 of the electronic substrate 310. As will be understood to those skilled in the art, the electronic substrate 310 may reroute a fine pitch (center-to-center distance between the bond pads) of the integrated circuit device bond pads 336 to a relatively wider pitch of the bond pads 338 on the second surface 314 of the electronic substrate 310. In one embodiment of the present description, external interconnects 340 may be disposed on the bond pads 338 on the second surface 314 of the electronic substrate 310. The external interconnects 340 may be any appropriate electrically conductive material, including, but not limited to, metal filled epoxies and solders, such as tin, lead/tin alloys (for example, 63% tin/37% lead solder), and high tin content alloys (e.g. 90% or more tin-such as tin/bismuth, eutectic tin/silver, ternary tin/silver/copper, eutectic tin/copper, and similar alloys). The external interconnects 340 may be used to attach the integrated circuit assembly 300 to an external substrate (not shown), such as a motherboard.

The heterogeneous dielectric layer 110, as shown in FIG. 1, can be formed by several processes or techniques. One process is illustrated in FIG. 11, which is a flow chart of a process 400 of fabricating the heterogeneous dielectric layer. As set forth in block 410, an encapsulation layer, in a substantially liquid state, may be formed. The encapsulation layer may be partially dried or cured, as set forth in block 420. As set forth in block 430, a bulk dielectric layer, in a substantially liquid state, may be formed on the encapsulation layer. The bulk dielectric layer may be partially dried or cured, as set forth in block 440. As set forth in block 450, a primer layer, in a substantially liquid state, may be formed on the bulk dielectric layer. The encapsulation layer, the bulk dielectric layer, and the primer layer may be simultaneously fully baked or cured, as set forth in block 460. As will be understood to those skilled in the art, the partial dry or cure step after the formation of each of the encapsulation layer and the bulk dielectric layer reduces solvent content and maintains the integrity of each of the layers. In one embodiment, the encapsulation layer, the bulk dielectric layer, and the primer layer may be formed by slit coating. In another embodiment, the encapsulation layer, the bulk dielectric layer, and the primer layer may each have appropriate and individual viscosities that are selected the conformal versus filling effects, as will be understood to those skilled in the art. To prevent excessive intermixing of partly dried layers, partially compatible base solvents between encapsulation layer and the bulk dielectric layer, and between the bulk dielectric layer and the primer layer may be used.

Figure 12:
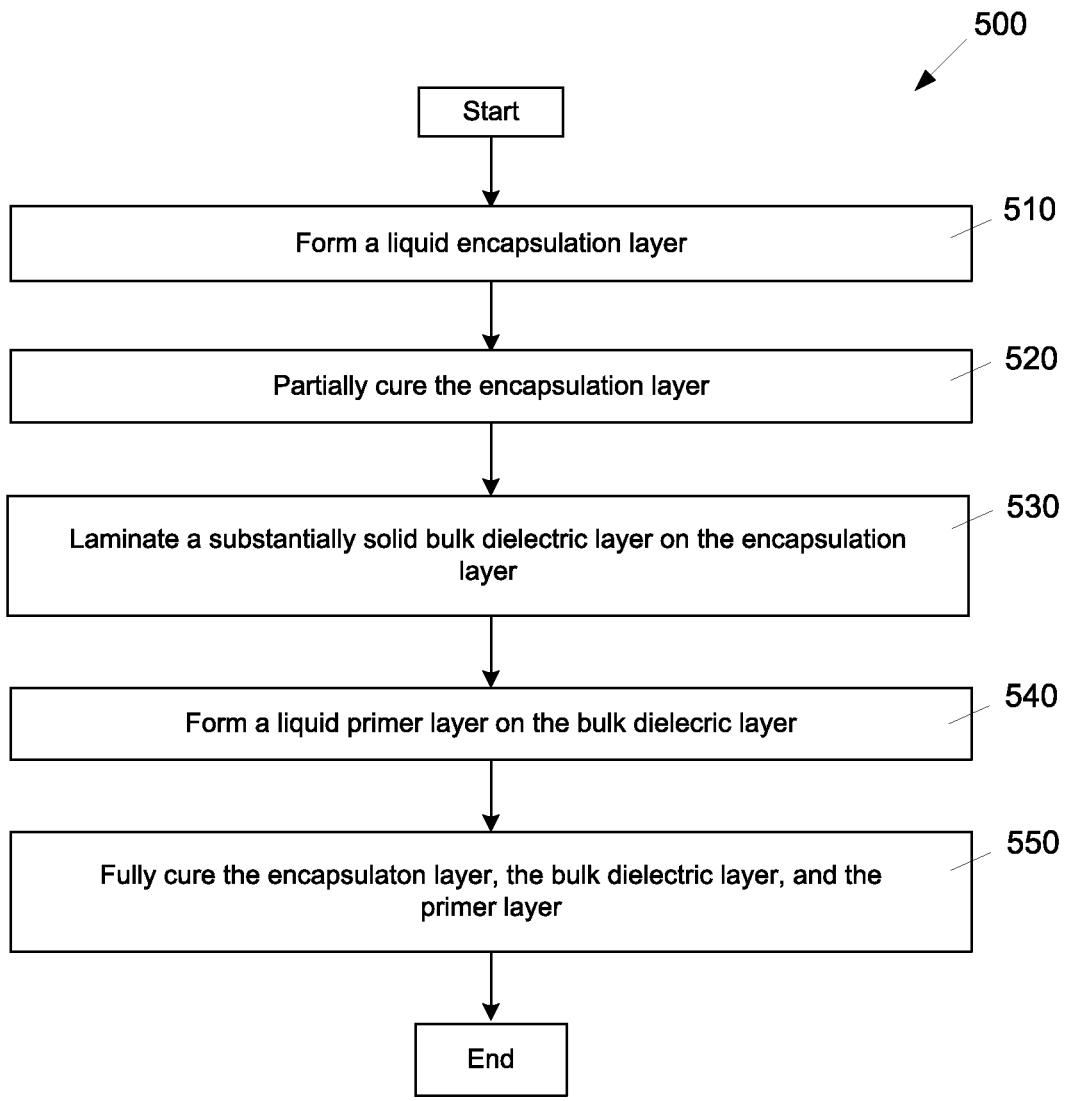
FIG. 12 is a flow chart of a process of fabricating a heterogeneous dielectric layer for an electronic substrate, according to another embodiment of the present description.

FIG. 12 is a flow chart of a process 500 of fabricating the heterogeneous dielectric layer, according to another embodiment of the present description. As set forth in block 510, an encapsulation layer, in a substantially liquid state, may be formed. The encapsulation layer may be partially dried or cured, as set forth in block 520. As set forth in block 530, a bulk dielectric layer, in a substantially dry or solid state, may be laminated on the encapsulation layer. A primer layer, in a substantially liquid state, may be formed on the bulk dielectric layer, as set forth in block 540. As set forth in block 550, the primer layer may be partially dried or cured. The encapsulation layer and the primer layer may be simultaneously fully baked or cured, as set forth in block 560. In one embodiment, the encapsulation layer and the primer layer may be formed by slit coating. As will be understood to those skilled in the art, the partial dry or cure step after the formation of the encapsulation layer is needed to prevent deformation of thereof from the lamination pressures of the application of the bulk dielectric material layer. In one embodiment, the encapsulation layer, the bulk dielectric layer, and the primer layer may each have appropriate and individual viscosities that are selected the conformal versus filling effects, as will be understood to those skilled in the art. To prevent excessive intermixing of partly dried layers, partially compatible base solvents between encapsulation layer and the bulk dielectric layer, and between the bulk dielectric layer and the primer layer may be used.

Figure 13:
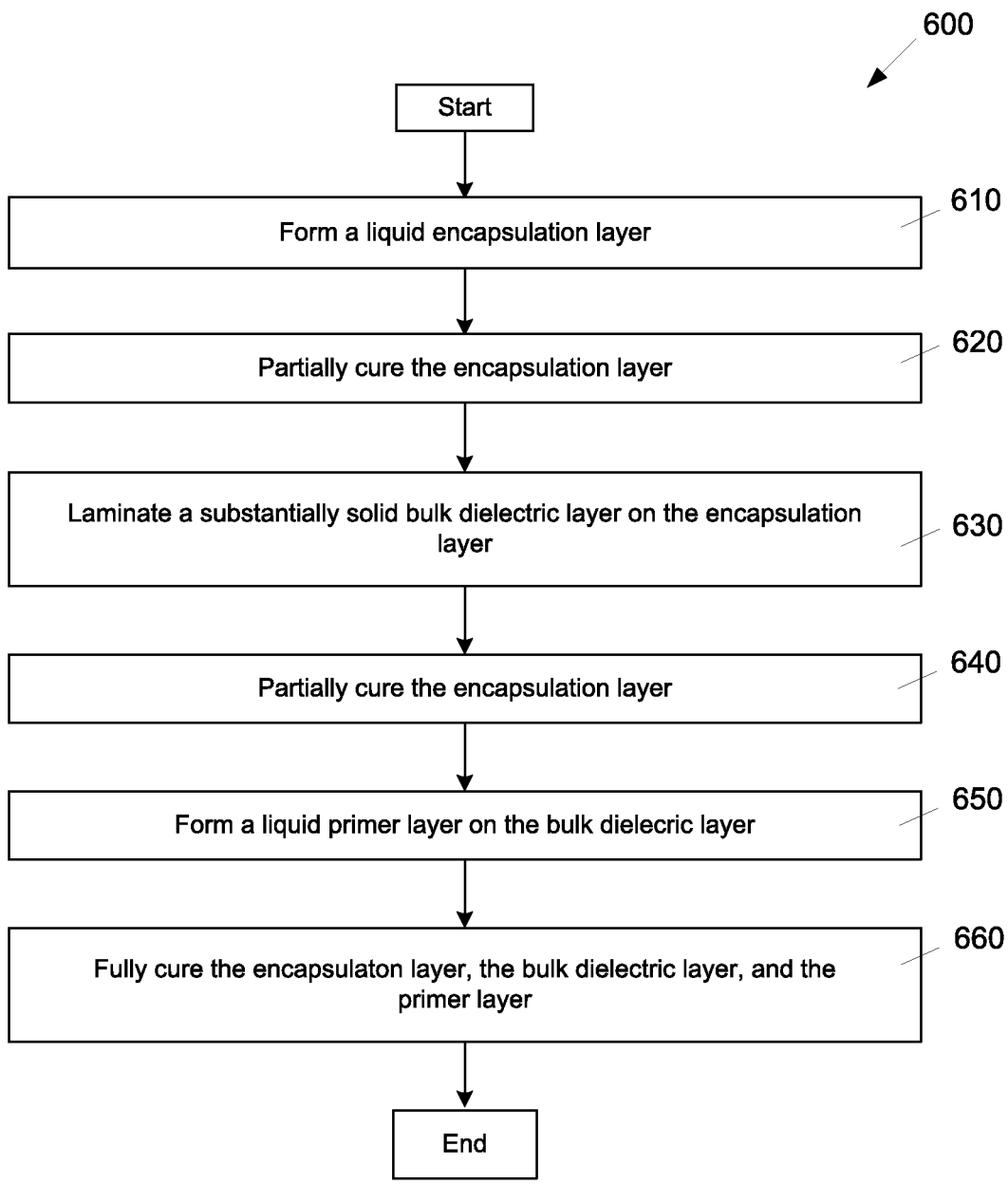
FIG. 13 is a flow chart of a process of fabricating a heterogeneous dielectric layer for an electronic substrate, according to still another embodiment of the present description.

FIG. 13 is a flow chart of a process 600 of fabricating the heterogeneous dielectric layer, according to another embodiment of the present description. As set forth in block 610, an encapsulation layer, in a substantially liquid state, may be formed. The encapsulation layer may be partially dried or cured, as set forth in block 620. As set forth in block 630, a bulk dielectric material layer, in a substantially dry or solid state, may be laminated on the encapsulation layer. The bulk dielectric material layer may be partially dried or cured, as set forth in block 640. As set forth in block 650, a primer layer, in a substantially liquid state, may be formed on the bulk dielectric layer. As set forth in block 660, the encapsulation layer, the bulk dielectric material layer, and the primer layer may be simultaneously fully baked or cured, as set forth in block 660. In one embodiment, the encapsulation layer and the primer layer may be formed by slit coating. As will be understood to those skilled in the art, the partial dry or cure step after the lamination of the bulk dielectric material layer may be needed to prevent excessive intermixing between the bulk dielectric material layer and the primer layer and to prevent potential for the delamination of any uncured portion of the bulk dielectric material layer and the cured portions of the bulk dielectric material layer.

Figure 14:
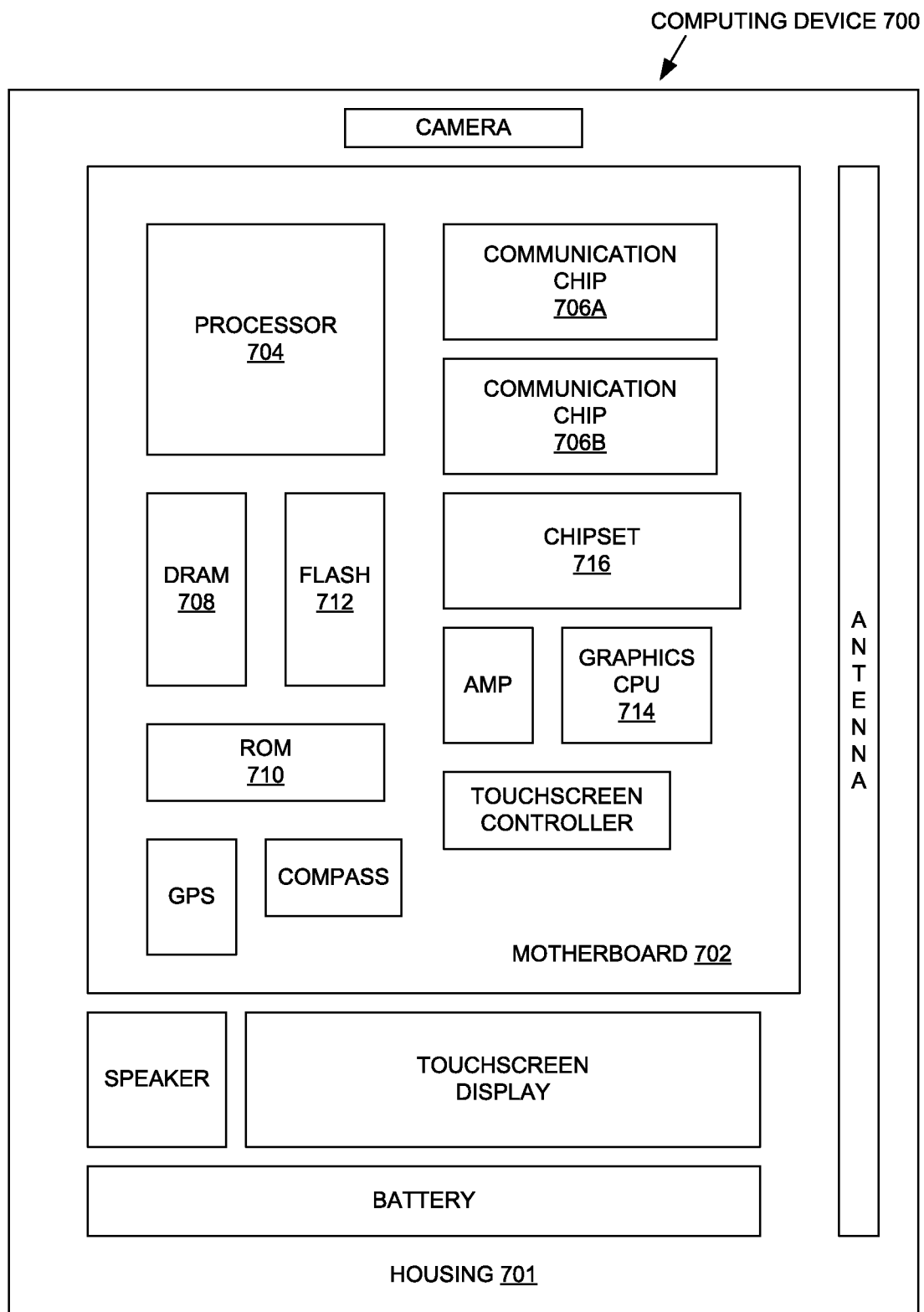
FIG. 14 is an electronic system, according to one embodiment of the present description.

FIG. 14 illustrates an electronic or computing device 700 in accordance with one implementation of the present description. The computing device 700 may include a housing 701 having a board 702 disposed therein. The computing device 700 may include a number of integrated circuit components, including but not limited to a processor 704, at least one communication chip 706A, 706B, volatile memory 708 (e.g., DRAM), non-volatile memory 410 (e.g., ROM), flash memory 712, a graphics processor or CPU 714, a digital signal processor (not shown), a crypto processor (not shown), a chipset 716, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 702. In some implementations, at least one of the integrated circuit components may be a part of the processor 704.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an electronic substrate wherein the electronic substate includes at least one heterogeneous dielectric material layer that comprises a bulk dielectric layer having a first surface and an opposing second surface, an encapsulation layer on the first surface of the bulk dielectric layer, and a primer layer on the second surface of the bulk dielectric layer.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-14. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is a heterogeneous dielectric material layer comprising a bulk dielectric layer having a first surface and an opposing second surface, an encapsulation layer on the first surface of the bulk dielectric layer, and a primer layer on the second surface of the bulk dielectric layer.

In Example 2, the subject matter of Example 1 can optionally include the bulk dielectric layer comprises a carrier material selected from the group consisting of epoxy resin, benzocyclobutene resin, polyolefin, and polyimide, with a filler material dispersed therein.

In Example 3, the subject matter of Example 2 can optionally include the bulk dielectric layer comprising less than or equal to about 80% by volume of filler material.

In Example 4, the subject matter of any of Examples 1 to 3 can optionally include the encapsulation layer comprising a carrier material selected from the group consisting of epoxy resin, perfluorocyclobutane resin, and perfluorinated alkyl resin, with a filler material dispersed therein.

In Example 5, the subject matter of Example 4 can optionally include the primer layer comprising less than or equal to about 50% by volume of filler material.

In Example 6, the subject matter of any of Examples 1 to 5 can optionally include the primer layer comprising a carrier material selected from the group consisting of epoxy resin and polyimide, with a filler material dispersed therein.

In Example 7, the subject matter of Example 6 can optionally include the primer layer comprising less than or equal to about 50% by volume of filler material.

Example 8 is an electronic assembly, comprising at least one microelectronic device electrically attached to an electronic substrate and wherein the electronic substrate comprises a dielectric material layer having at least one conductive trace thereon; a heterogeneous dielectric material layer on the dielectric material layer, wherein the heterogeneous comprises an encapsulation layer on the dielectric material layer and the at least one conductive trace, a bulk dielectric layer on the encapsulation layer, and a primer layer on the second surface of the bulk dielectric layer; and at least one conductive via extending through the heterogeneous dielectric material layer, wherein the at least one conductive via electrically contacts the at least one conductive trace.

In Example 9, the subject matter of Example 8 can optionally include at least one microelectronic device electrically attached to the electronic substrate.

In Example 10, the subject matter of any of Examples 8 and 9 can optionally include the bulk dielectric layer comprising a carrier material selected from the group consisting of epoxy resin, benzocyclobutene resin, polyolefin, and polyimide, with a filler material dispersed therein.

In Example 11, the subject matter of Example 10 can optionally include the bulk dielectric layer comprising less than or equal to about 80% by volume of filler material.

In Example 12, the subject matter of any of Examples 8 to 11 can optionally include the encapsulation layer being selected from the group consisting of epoxy resin, perfluorocyclobutane resin, and perfluorinated alkyl resin with a filler material dispersed therein.

In Example 13, the subject matter of Example 12 can optionally include the encapsulation layer comprising less than or equal to about 50% by volume of filler material.

In Example 14, the subject matter of any of Examples 8 to 13 can optionally include the encapsulation layer being conformal.

In Example 15, the subject matter of any of Examples 8 to 14 can optionally include the primer layer comprising carrier material selected from the group consisting of epoxy resin and polyimide, with a filler material dispersed therein.

In Example 16, the subject matter of Example 15 can optionally include the primer layer comprises less than or equal to about 50% by volume of filler material.

Example 17 is an electronic system, comprising an electronic board and an electronic assembly electrically attached to the electronic board, wherein the electronic assembly includes at least one microelectronic device electrically attached to an electronic substrate and wherein the electronic substrate comprises a dielectric material layer having at least one conductive trace thereon; a heterogeneous dielectric material layer on the dielectric material layer, wherein the heterogeneous comprises an encapsulation layer on the dielectric material layer and the at least one conductive trace, a bulk dielectric layer on the encapsulation layer, and a primer layer on the second surface of the bulk dielectric layer; and at least one conductive via extending through the heterogeneous dielectric material layer, wherein the at least one conductive via electrically contacts the at least one conductive trace.

In Example 18, the subject matter of Example 17 can optionally include the bulk dielectric layer comprising a carrier material selected from the group consisting of epoxy resin, benzocyclobutene resin, polyolefin, and polyimide, with a filler material dispersed therein.

In Example 19, the subject matter of Example 18 can optionally include the bulk dielectric layer comprising less than or equal to about 80% by volume of filler material.

In Example 20, the subject matter of any of Examples 17 to 19 can optionally include the encapsulation layer being selected from the group consisting of epoxy resin, perfluorocyclobutane resin, and perfluorinated alkyl resin, with a filler material dispersed therein.

In Example 21, the subject matter of Example 20 can optionally include the encapsulation layer comprises less than or equal to about 50% by volume of filler material.

In Example 22, the subject matter of any of Examples 17 to 21 can optionally include the encapsulation layer being conformal.

In Example 23, the subject matter of any of Examples 17 to 22 can optionally include the primer layer comprising carrier material selected from the group consisting of epoxy resin and polyimide, with a filler material dispersed therein.

In Example 24, the subject matter of Example 23 can optionally include the primer layer comprises less than or equal to about 50% by volume of filler material.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
    a substrate comprising a dielectric material layer having a first conductive trace on a top surface thereof;
    a multilayer dielectric over the dielectric material layer and the first conductive trace, the multilayer dielectric comprising:
        a first layer on the dielectric material layer and the first conductive trace, wherein the first layer has a thickness of not more than 5 microns and is a material selected from the group consisting of epoxy resin, perfluorocyclobutane resin, and perfluorinated alkyl resin;
        a second layer on the first layer; and
        a third layer on the second layer, wherein the third layer has a thickness of not more than 5 microns and comprises a first carrier material with a first filler material dispersed therein, the first filler material having a volume percentage of not more than 50% of the third layer, and
        wherein the second layer is thicker than each of the first layer and the third layer and comprises a second carrier material with a second filler material dispersed therein, the second filler material being a greater volume percentage of the second layer than the volume percentage of the first filler material of the third layer;
    a second conductive trace on a top surface of the third layer; and
    a conductive via extending through the first layer, the second layer, and the third layer and in contact with a top surface of the first conductive trace and a bottom surface of the second conductive trace.

2. The apparatus of claim 1, wherein the second carrier material of the second layer comprises one of epoxy resin, benzocyclobutene resin, polyolefin, or polyimide.

3. The apparatus of claim 2, wherein the second filler material of the second layer comprises silica.

4. The apparatus of claim 1, wherein the first layer is functionalized with an aromatic amine and the third layer is functionalized with a carbodiimide.

5. The apparatus of claim 1, wherein the first carrier material of the third layer comprises epoxy resin or polyimide.

6. The apparatus of claim 5, wherein the first filler material of the third layer comprises silica.

7. The apparatus of claim 1, further comprising a microelectronic device and/or a board coupled to the substrate.

8. An apparatus, comprising:
    a substrate comprising a dielectric material layer having a first conductive trace on a top surface thereof;
    a multilayer dielectric over the dielectric material layer and the first conductive trace, the multilayer dielectric comprising:
        a first layer on the dielectric material layer and the first conductive trace, wherein the first layer has a thickness of not more than 5 microns and comprises a first carrier material with a first filler material dispersed therein, the first filler material having a volume percentage of not more than 50% of the first layer;
        a second layer on the first layer, wherein the second layer comprises a second carrier material with a second filler material dispersed therein; and
        a third layer on the second layer, wherein the third layer has a thickness of not more than 5 microns and comprises a third carrier material with a third filler material dispersed therein, the third filler material having a volume percentage of not more than 50% of the third layer, and
        wherein the second layer is thicker than each of the first layer and the third layer, and the second filler material has a greater volume percentage of the second layer than each of the volume percentage of the first filler material of the first layer and the volume percentage of the third filler material of the third layer;
    a second conductive trace on a top surface of the third layer; and
    a conductive via extending through the first layer, the second layer, and the third layer and in contact with a top surface of the first conductive trace and a bottom surface of the second conductive trace.

9. The apparatus of claim 8, wherein the first carrier material of the first layer comprises one of epoxy resin, perfluorocyclobutane resin, or perfluorinated alkyl resin, the second carrier material of the second layer comprises one of epoxy resin, benzocyclobutene resin, polyolefin, or polyimide, and the third carrier material of the third layer comprises one of epoxy resin or polyimide.

10. The apparatus of claim 9, wherein the first filler material of the first layer, the second filler material of the second layer, and the third filler material of the third layer each comprises silica.

11. The apparatus of claim 8, wherein the first layer is functionalized with an aromatic amine and the third layer is functionalized with a carbodiimide.

12. The apparatus of claim 8, wherein the second filler material of the second layer has a volume percentage of not more than 80% of the second layer.

13. The apparatus of claim 8, further comprising a microelectronic device and/or a board coupled to the substrate.

14. An apparatus, comprising:
    a substrate comprising a dielectric material layer having a first conductive trace on a top surface thereof;
    a multilayer dielectric over the dielectric material layer and the first conductive trace, the multilayer dielectric comprising:
        a first layer on the dielectric material layer and the first conductive trace, wherein the first layer has a thickness of not more than 5 microns and comprises a first carrier material with a first filler material dispersed therein, the first filler material having a volume percentage of not more than 50% of the first layer and having an average diameter on the nanometer level;
        a second layer on the first layer, wherein the second layer comprises a second carrier material with a second filler material dispersed therein, the second filler material having an average diameter on the micrometer level; and
        a third layer on the second layer, wherein the third layer has a thickness of not more than 5 microns and comprises a third carrier material with a third filler material dispersed therein, the third filler material having a volume percentage of not more than 50% of the third layer, and
        wherein the second layer is thicker than each of the first layer and the third layer;
    a second conductive trace on a top surface of the third layer; and
    a conductive via extending through the first layer, the second layer, and the third layer and in contact with a top surface of the first conductive trace and a bottom surface of the second conductive trace.

15. The apparatus of claim 14, wherein the second filler material has a greater volume percentage of the second layer than each of the volume percentage of the first filler material of the first layer and the volume percentage of the third filler material of the third layer.

16. The apparatus of claim 15, wherein the first filler material of the first layer, the second filler material of the second layer, and the third filler material of the third layer each comprises silica.

17. The apparatus of claim 14, wherein the first carrier material of the first layer comprises one of epoxy resin, perfluorocyclobutane resin, or perfluorinated alkyl resin, the second carrier material of the second layer comprises one of epoxy resin, benzocyclobutene resin, polyolefin, or polyimide, and the third carrier material of the third layer comprises one of epoxy resin or polyimide.

18. The apparatus of claim 14, wherein the first layer is functionalized with an aromatic amine and the third layer is functionalized with a carbodiimide.

19. The apparatus of claim 14, wherein the second filler material of the second layer has a volume percentage of not more than 80% of the second layer.

20. The apparatus of claim 14, further comprising a microelectronic device and/or a board coupled to the substrate.

* * * * *